(12) United States Patent
Futatsuyama (10) Patent No.: US 7,738,313 B2
(45) Date of Patent: Jun. 15, 2010

(54) NONVOLATILE SEMICONDUCTOR STORAGE DEVICE

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 11/862,691

(22) Filed: Sep. 27, 2007

(65) Prior Publication Data

US 2009/0225599 A1    Sep. 10, 2009

(30) Foreign Application Priority Data

Sep. 28, 2006   (JP)   ............... P2006-264274

(51) Int. Cl.
*G11C 8/00* (2006.01)
(52) U.S. Cl. ............... 365/230.06; 365/185.05; 365/230.03
(58) Field of Classification Search ............ 365/230.06, 365/230.03, 185.05, 185.11
See application file for complete search history.

(56) References Cited

U.S. PATENT DOCUMENTS 5,703,804 A * 12/1997 Takata et al. ............... 365/145

| | | | |
|---|---|---|---|
| 6,337,807 B2 | 1/2002 | Futatsuyama et al. | |
| 6,873,561 B2 * | 3/2005 | Ooishi | ............... 365/226 |
| 6,903,981 B2 * | 6/2005 | Futatsuyama et al. | .. 365/185.33 |
| 6,947,317 B2 * | 9/2005 | Iwata | ............... 365/158 |
| 7,151,686 B2 | 12/2006 | Sugimae et al. | |
| 2005/0094428 A1 | 5/2005 | Futatsuyama et al. | |

FOREIGN PATENT DOCUMENTS

| JP | 2001-189087 | 7/2001 |
|---|---|---|
| JP | 2005-100538 | 4/2005 |
| JP | 2005-190665 | 7/2005 |

* cited by examiner

*Primary Examiner*—Son Dinh
(74) *Attorney, Agent, or Firm*—Oblon, Spivak, McClelland, Maier & Neustadt, L.L.P.

(57) ABSTRACT

A nonvolatile semiconductor memory comprising: a plurality of memory cell blocks each including a plurality of memory cells serially connected to each other; a word line that is connected to corresponding ones of the plurality of memory cells each included in respective one of the plurality of memory cellblocks; and a pair of drive circuits each configured to apply a voltage to the word line, wherein the corresponding ones of the plurality of memory cells are connected to the word line between the pair of drive circuits.

18 Claims, 12 Drawing Sheets

NONVOLATILE SEMICONDUCTOR STORAGE DEVICE

CROSS-REFERENCE TO RELATED APPLICATIONS

This application is based upon and claims the benefit of priority from Japanese Patent Application No. 2006-264274, filed Sep. 28, 2006, the entire contents of which are incorporated herein by reference.

BACKGROUND OF THE INVENTION

One embodiment of the invention relates to a nonvolatile semiconductor storage device which is electrically rewritable.

Among nonvolatile semiconductor storage devices are ones that enable electrical rewriting of information, one example of which is disclosed in Patent document JP-A-2005-190665.

Such nonvolatile semiconductor storage devices include ones that are provided with plural memory blocks (NAND cell blocks). Each memory cell block has plural NAND cells. And each NAND cell has plural memory cells, that is, each NAND cell has a series connection of plural memory cells.

The plural NAND cells in each memory cell block are connected together by a word line.

In such nonvolatile semiconductor storage devices, a pair of row decoders is opposed to each other with each memory cell blocks interposed in between. And each of the pair of row decoders is connected to word lines. When a pair of row decoders applies voltages to word lines, the word lines are activated and the memory cell block connected to the activated word lines is driven.

SUMMARY OF THE INVENTION

According to an aspect of the present invention, there is provided a nonvolatile semiconductor memory comprising: a plurality of memory cell blocks each including a plurality of memory cells serially connected to each other; a word line that is connected to corresponding ones of the plurality of memory cells each included in respective one of the plurality of memory cell blocks; and a pair of drive circuits each configured to apply a voltage to the word line, wherein the corresponding ones of the plurality of memory cells are connected to the word line between the pair of drive circuits.

According to another aspect of the present invention, there is provided a nonvolatile semiconductor memory comprising: a first memory cell block that includes a plurality of first memory cells; a second memory cell block that includes a plurality of second memory cells; a first word line that is connected to the first memory cells; a second word line that is connected to the second memory cells and the first word line; and a pair of drive circuits each connected to the first and second word line, wherein the first memory cells are connected to the first word line between the pair of drive circuits, and wherein the second memory cells are connected to the second word line between the pair of drive circuits.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

First Embodiment

Figure 1:
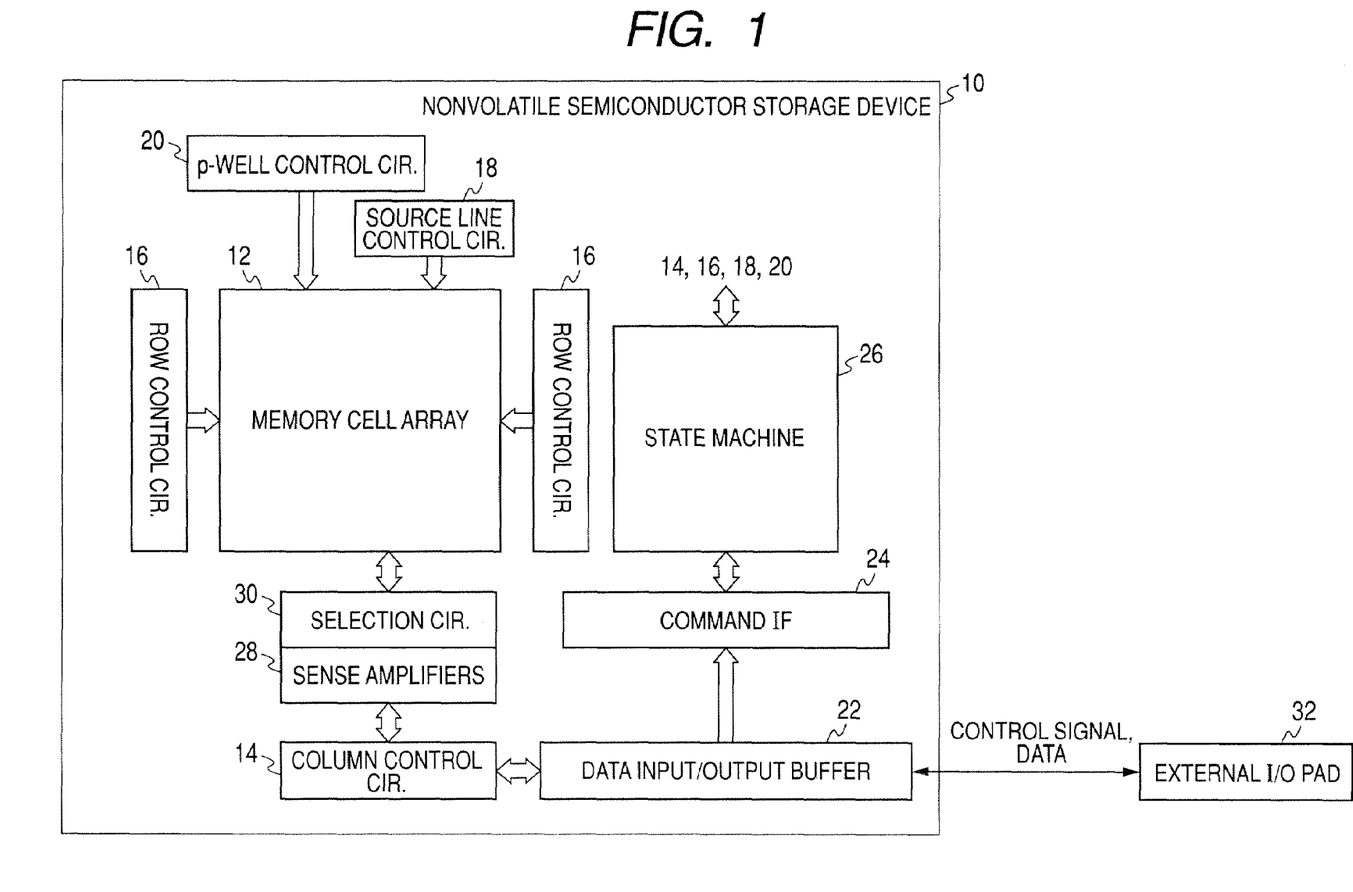
FIG. 1 outlines the configuration of a nonvolatile semiconductor storage device according to a first embodiment of the present invention.

FIG. 1 outlines the configuration of a nonvolatile semiconductor storage device 10 according to a first embodiment of the present invention. The nonvolatile semiconductor storage device 10 has a memory cell array 12, a column control circuit (column decoder) 14, row control circuits (row decoders) 16, a source line control circuit 18, a cell well control circuit 20, a data input/output buffer 22, a command interface 24, a state machine 26, sense amplifiers 28, and a selection circuit 30. The nonvolatile semiconductor storage device 10 exchanges a control signal (command) and data with an external I/O pad 32.

In the nonvolatile semiconductor storage device 10 according to the first embodiment of the invention, a control signal and data are input from the external I/O pad 32 to the command interface 24 and the column control circuit 14 via the data input/output buffer 22. The state machine 26 controls the column control circuit 14, the row control circuits 16, the source line control circuit 18, and the cell well control circuit 20 on the basis of the control signal and the data that are received via the data input/output buffer 22 and the command interface 24. The state machine 26 generates address information for accessing memory cells in the memory cell array 12 on the basis of the control signal, and outputs the address information to the column control circuit 14 and the row control circuits 16. Furthermore, the state machine 26 outputs the data to the column control circuit 14 and the row control circuits 16. The column control circuit 14 controls the sense amplifiers 28 and the selection circuit 30 on the basis of the address information and the data that are received from the state machine 26, and renders memory cells MC shown in FIG. 7 active (they are denoted by symbols MC0-MC15 in FIG. 7) so that data reading, writing, or erasure is performed. The sense amplifiers 28, which are connected to respective bit lines (not shown) of the memory cell array 12, are formed by plural data caches. The sense amplifiers 28 supply data to the bit lines, and hold potentials of the bit lines by means of the data caches. Data that has been read from memory cells by the sense amplifiers 28 controlled by the column control circuit 14 is output to the external I/O pad 32 via the data input/output buffer 22. The selection circuit 30 selects data caches to be connected to the bit lines among the plural data caches that constitute the sense amplifiers 28.

Figure 2:
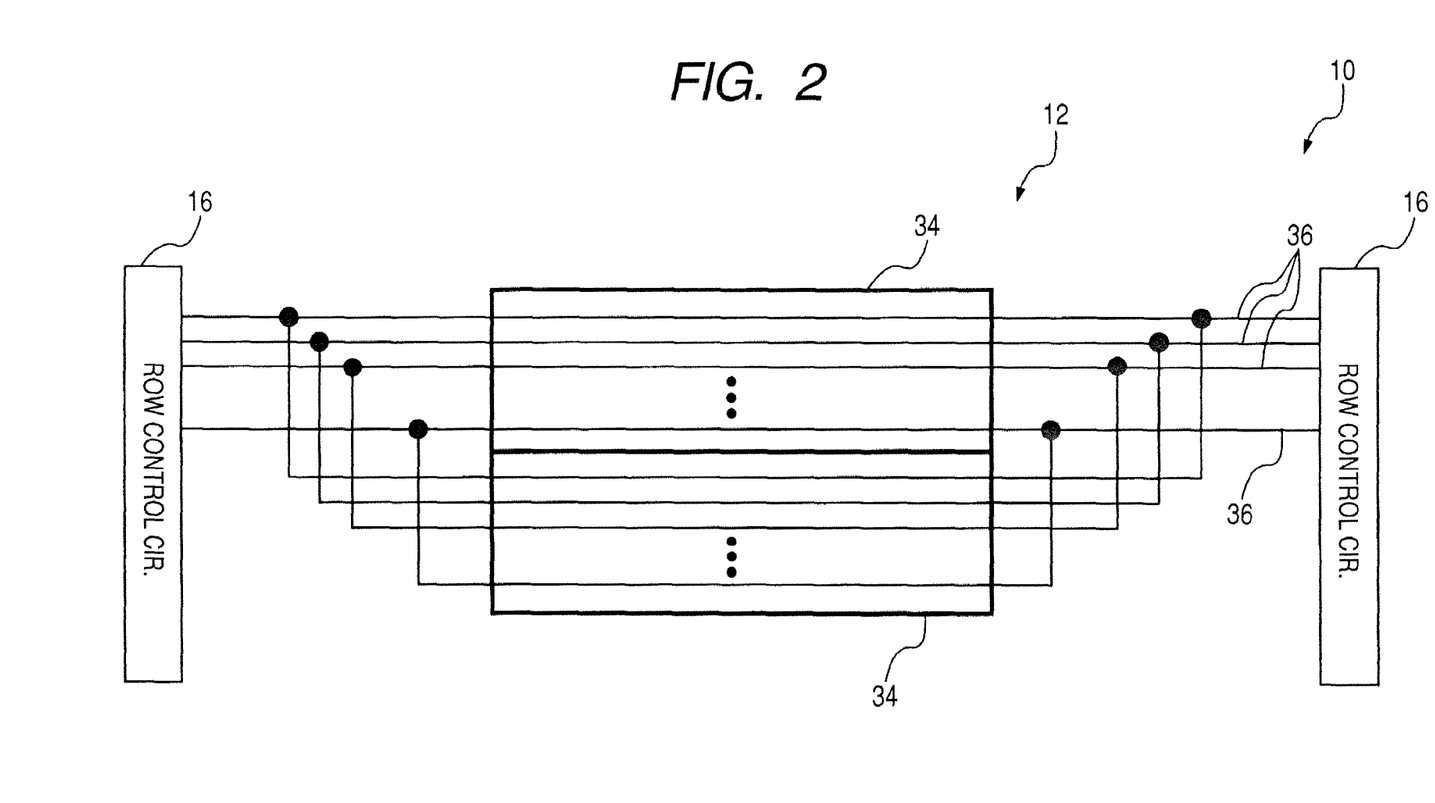
FIG. 2 is an exemplary schematic diagram showing a relationship between a memory cell array and row control circuits according to the first embodiment of the invention.

FIG. 2 is a schematic diagram showing a relationship between the memory cell array 12 and the row control circuits 16. The memory cell array 12 has plural memory cell blocks 34 (two memory cell blocks 34 are shown in FIG. 2). Each memory cell block 34 has plural NAND cell units 35 (see FIG. 7). Each NAND cell unit 35 is a series connection of memory cells MC0-MC15. Each memory cell block 34 is a series connection of plural NAND cell units 35.

The plural memory cell blocks 34 are arranged adjacent to each other in a direction that is approximately perpendicular to the series connection direction of the NAND cell units 35 in the memory cell array 12 (i.e., in a direction that crosses the series connection direction of the NAND cell units 35).

Figure 3:
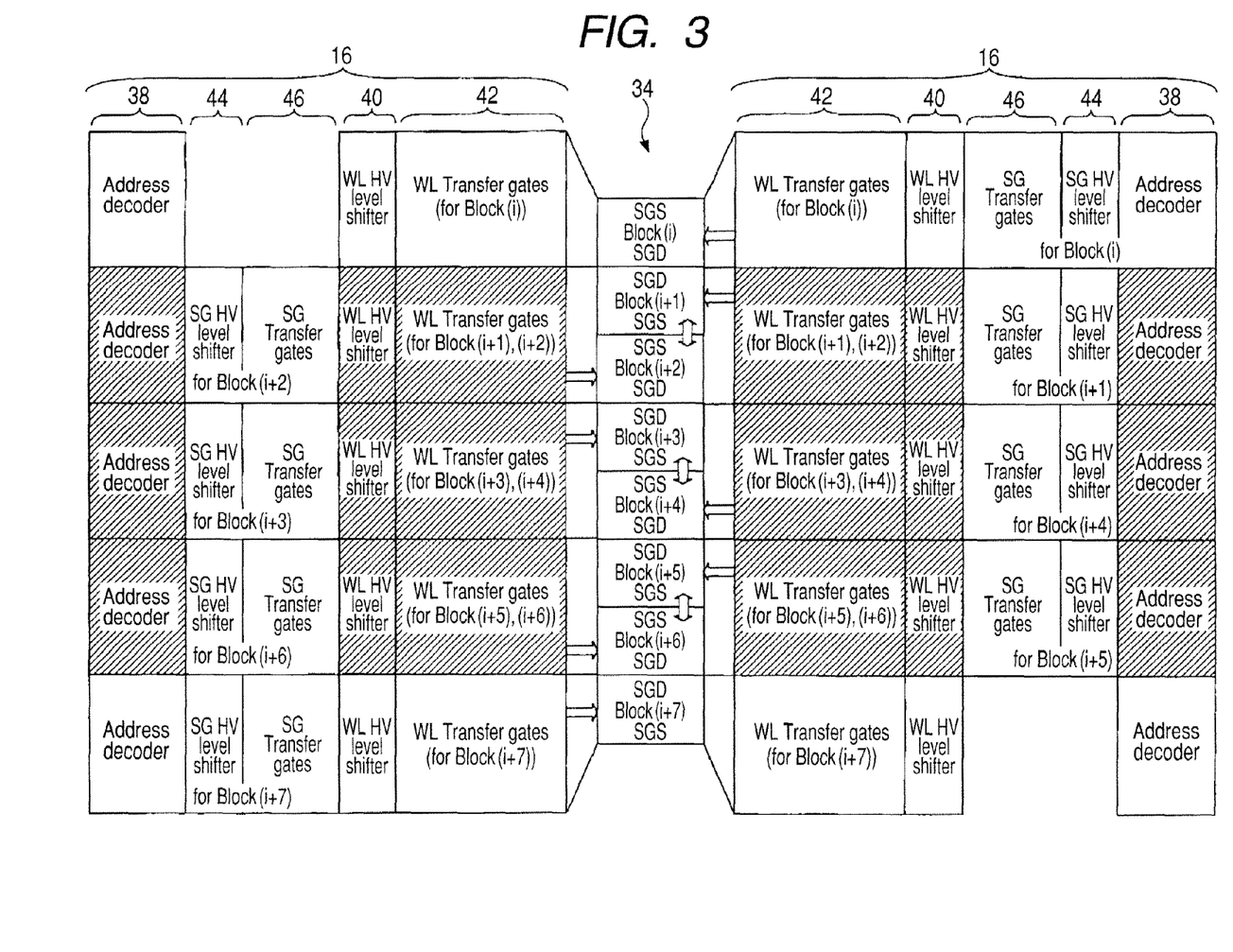
FIG. 3 is an exemplary layout diagram showing the layout of row control circuits according to the first embodiment of the invention.
Figure 4:
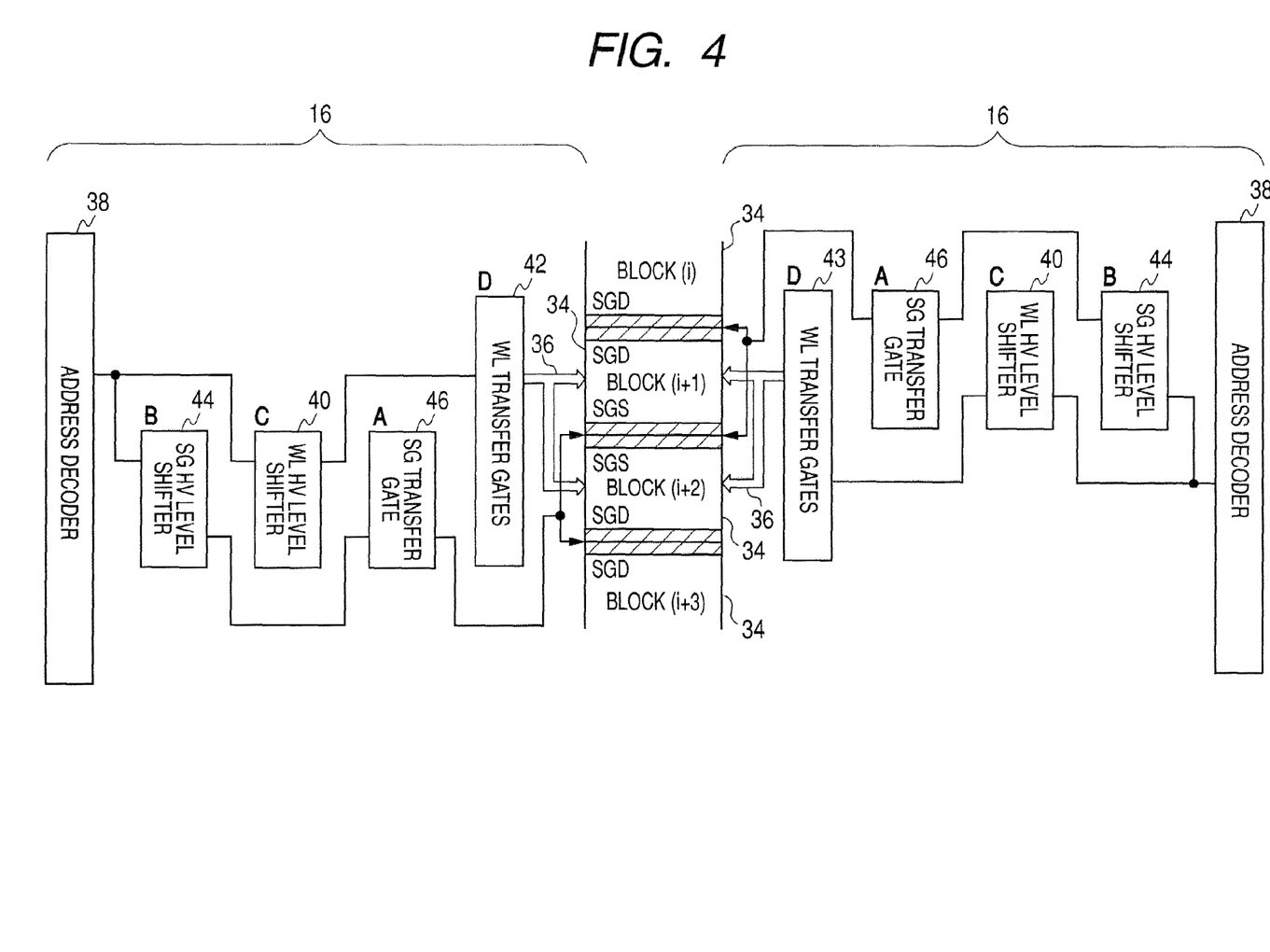
FIG. 4 is an exemplary block diagram showing an important part of the nonvolatile semiconductor storage device according to the first embodiment of the invention.

Word lines 36 are connected to (i.e., shared by) both of two adjoining memory cell blocks 34. In this embodiment, as shown in FIGS. 3 and 4, word lines 36 are shared by both of a memory cell block 34 that is a block i+2×k−1 and a memory cell block 34 that is a block i+2×k, where i is a prescribed integer and k is an arbitrary integer that is greater than or equal to 1 (i.e., an arbitrary natural number). For example, word lines 36 are shared by a memory cell block 34 that is a block i+1 and a memory cell block 34 that is a block i+2 (i.e., two memory cell blocks 34 corresponding to k being equal to 1).

As shown in FIG. 2, a pair of row control circuits 16 are provided on both (i.e., right and left) sides of the memory cell blocks 34. The pair of row control circuits 16 is opposed to each other with the plural memory cell blocks 34 interposed in between. The pair of row control circuits 16 is connected to each other via plural word lines 36. The pair of row control circuits 16 activates a desired word line 36 selectively by applying voltages to it and supply signals for driving of memory cells MC, connected to the selected word line 36, in the memory cell blocks 34.

As shown in FIGS. 3 and 4, each row control circuit 16 has an address decoder 38. The address decoder 38 generates and outputs an RDECAD signal for accessing memory cells MC in the memory cell array 12 on the basis of address information that is output from the state machine 26. A word line high-voltage (high-breakdown-voltage or high-voltage tolerance) level shifter (WL HV level shifter) 40 is connected to the address decoder 38. The RDECAD signal is a decode signal for simultaneously selecting blocks i+1 and i+2 (memory cell blocks 34).

Figure 6:
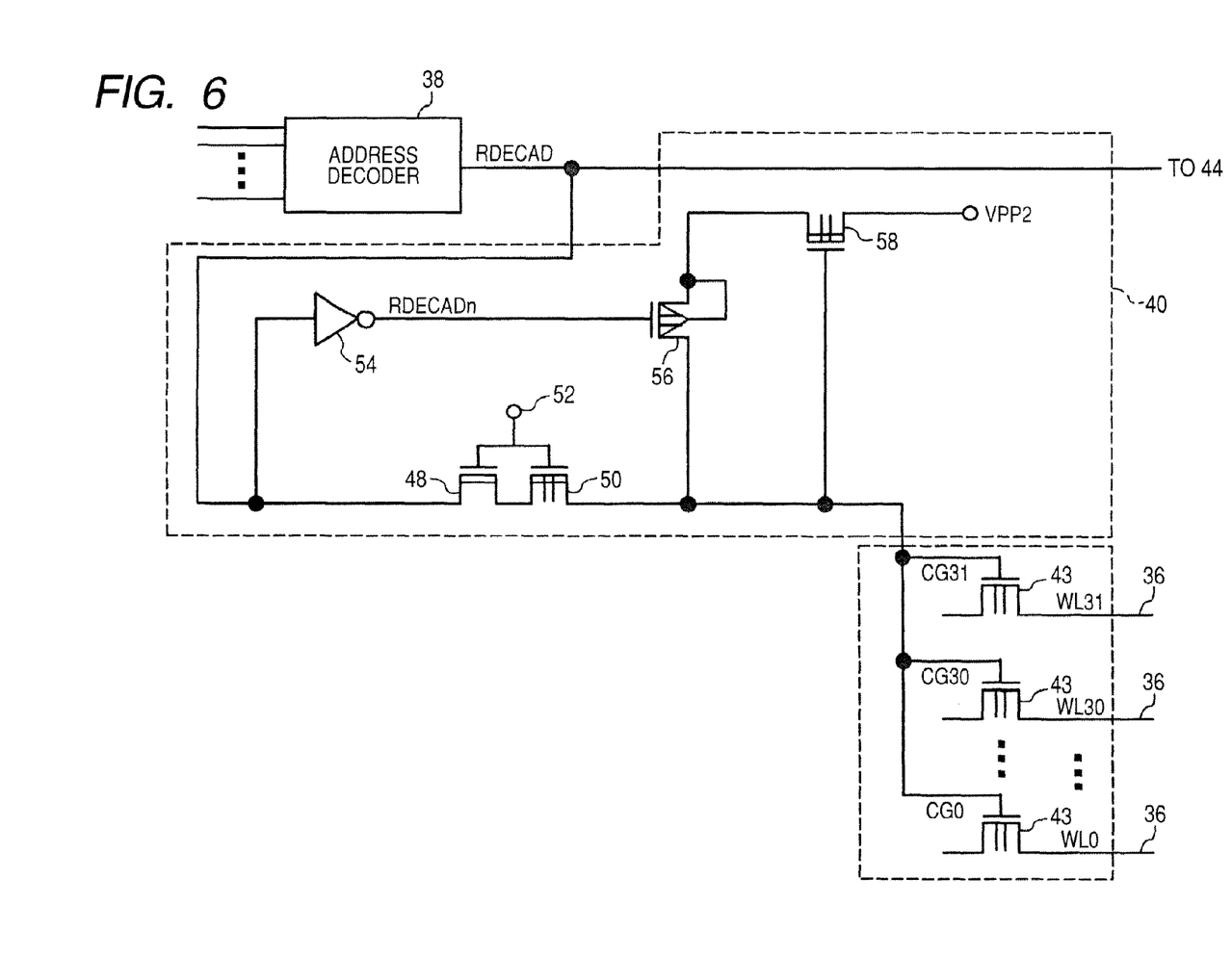
FIG. 6 is another exemplary circuit diagram showing the configuration of each row control circuit according to the first embodiment of the invention.

As shown in FIG. 6, the word line high-voltage level shifter 40 is provided with a depletion-type NMOS transistor 48. The source terminal of the depletion-type NMOS transistor 48 is connected to the address decoder 38 and its drain terminal is connected to the source terminal of a high-voltage depletion-type NMOS transistor 50. The gate terminals of the high-voltage depletion-type NMOS transistor 50 and the depletion-type NMOS transistor 48 are together connected to a BSTON terminal 52. When receiving a signal (H-level signal) from the BSTON terminal together, the high-voltage depletion-type NMOS transistor 50 and the depletion-type NMOS transistor 48 pass an RDECAD signal that is output from the address decoder 38, that is, transmit it to the drain terminal of the high-voltage depletion-type NMOS transistor 50.

The signal line that connects the address decoder 38 to the depletion-type NMOS transistor 48 is also connected to the input terminal of an inverter 54. When receiving an RDECAD signal that is output from the address decoder 38, the inverter 54 outputs an RDECADn signal which is an inverted level of the RDECAD signal.

The gate terminal of a high-voltage PMOS transistor 56 is connected to the output terminal of the inverter 54. The drain terminal of the high-voltage PMOS transistor 56 is connected to the drain terminal of the above-mentioned high-voltage depletion-type NMOS transistor 50, and its source terminal is connected to the source terminal of a high-voltage depletion-type NMOS transistor 58 and its own substrate terminal. The gate terminal of the high-voltage depletion-type NMOS transistor 58 is connected to the drain terminal of the high-voltage depletion-type NMOS transistor 50. The thus-connected high-voltage depletion-type NMOS transistor 58 passes, to the source terminal of the high-voltage PMOS transistor 56, a boosted power supply voltage VPP2 which is input to the source terminal of the high-voltage depletion-type NMOS transistor 58.

The drain terminal of the high-voltage depletion-type NMOS transistor 50 is connected to all of the gate terminals of word line transfer gates 43. The word line transfer gates 43 are plural (in the first embodiment, 32) high-voltage NMOS transistors. The above-mentioned word lines 36 are connected to the source terminals of the word line transfer gates 43, respectively. Signal lines CG0, CG1, . . . , CG31 are connected to the drain terminals of the word line transfer gates 43, respectively. The signal lines CG0, CG1, . . . , CG31 supply voltages to the word lines of a selected memory cell block. If the word line high-voltage level shifter 40 shown in FIG. 6 corresponds to a selected memory block (i.e., the REDCAD signal is at the H-level), an H-level voltage is transferred to the gate terminals of the word line transfer gates 43 and the high-voltage PMOS transistor 56 and the high-voltage depletion-type NMOS transistor 58 are turned on. And the voltage VPP2 is transferred to the gate terminals of the word line transfer gates 43 through positive feedback voltage amplification. If the word line high-voltage level shifter 40 shown in FIG. 6 corresponds to an unselected block (i.e., the REDCAD signal is at the L-level), an L-level voltage is transferred to the gate terminals of the word line transfer gates 43 and the high-voltage PMOS transistor 56 and the high-voltage depletion-type NMOS transistor 58 are cut off and the gate terminals of the word line transfer gates 43 are set at the L-level. The word lines 36 can be activated (given signals) or deactivated (not given signals) by on/off-controlling the word line transfer gates 43 according to the RDECAD signal in the above manner.

Figure 5:
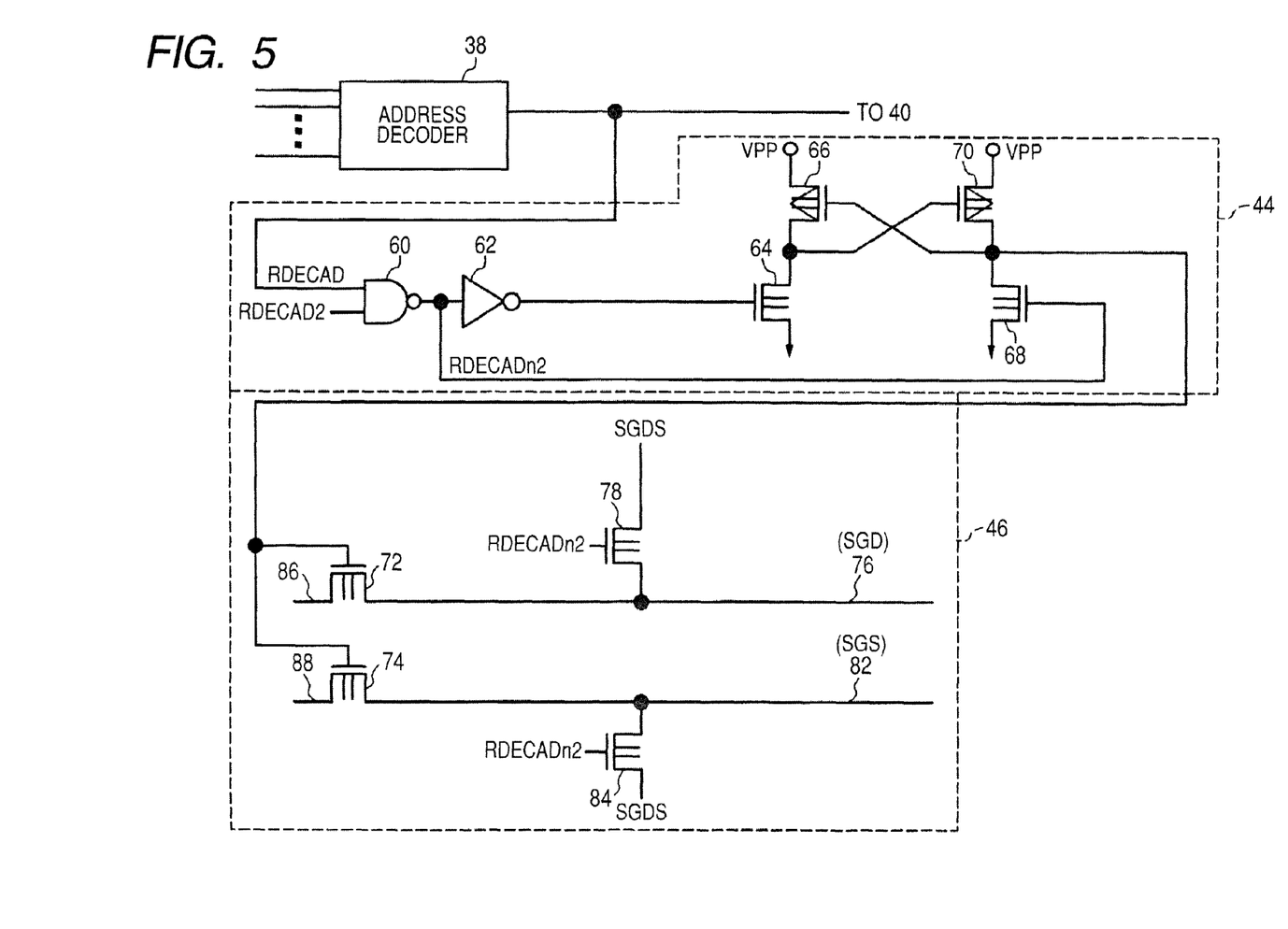
FIG. 5 is an exemplary circuit diagram showing the configuration of each row control circuit according to the first embodiment of the invention.

On the other hand, as shown in FIG. 4, a signal line that branches off the signal line connecting the address decoder 38 to the word line high-voltage level shifter 40 is connected to an SG high-voltage level shifter (SG HV level shifter) 44 shown in FIG. 5. The SG HV level shifter 44 is provided with a NAND circuit 60. The above-mentioned REDCAD signal (in FIG. 4, a signal for selecting the blocks i+1 and i+2 (memory cell blocks 34) simultaneously) which is output from the address decoder 38 is supplied to a first input terminal of the NAND circuit 60. An RDECAD2 signal is supplied to a second input terminal of the NAND circuit 60. In the left-hand row control circuit 16, the RDECAD2 signal, which is associated with the REDCAD signal, is an address signal for designating the block i+2 (memory block 34). In the right-hand row control circuit 16, the RDECAD2 signal is an address signal for designating the block i+1 (memory block 34).

An inverter circuit 62 is connected to an output terminal RDECADn2 of the NAND circuit 60. The inverter circuit 62 outputs a decode signal for selecting a prescribed memory cell block 34, on the basis of a signal that is output from the NAND circuit 60. The NAND circuit 60 and the inverter circuit 62 generate an AND signal of the REDCAD signal and the RDECAD2 signal. That is, in the left-hand row control circuit 16, the NAND circuit 60 and the inverter circuit 62 generate a decode signal for selecting the block i+2 (memory block 34; see FIGS. 3 and 4). In the right-hand row control circuit 16, the NAND circuit 60 and the inverter circuit 62 generate a decode signal for selecting the block i+1 (memory block 34).

The gate terminal of a high-voltage NMOS transistor 64 is connected to the output terminal of the inverter circuit 62. The source terminal of the high-voltage NMOS transistor 64 is supplied with a ground potential, and its drain terminal is connected to the drain terminal of a high-voltage PMOS transistor 66. The source terminal of the high-voltage PMOS transistor 66 is supplied with a boosted power supply voltage VPP. The output terminal RDECADn2 of the NAND circuit 60 is also connected to the gate terminal of a high-voltage NMOS transistor 68. The source terminal of the high-voltage NMOS transistor 68 is supplied with the ground potential, and its drain terminal is connected to the drain terminal of a high-voltage PMOS transistor 70. The source terminal of the high-voltage PMOS transistor 70 is supplied with the boosted power supply voltage VPP. The gate terminal of the high-voltage PMOS transistor 70 is connected to the connecting point of the above-mentioned high-voltage NMOS transistor 64 and the high-voltage PMOS transistor 66. The connecting point of the high-voltage NMOS transistor 68 and the high-voltage PMOS transistor 70 is connected to the gate terminal of the above-mentioned high-voltage PMOS transistor 66. The connecting point of the high-voltage NMOS transistor 68 and the high-voltage PMOS transistor 70 is also connected to both of the gate terminals of SG transfer gates 72 and 74.

Since the high-voltage NMOS transistor 64, the high-voltage PMOS transistor 66, the high-voltage NMOS transistor 68, and the high-voltage PMOS transistor 70 are connected in the above-described manner, they output an L-level voltage to the gate terminals of the SG transfer gates 72 and 74 if the decode signal that is output from the inverter circuit 62 is at the L level, and outputs the boosted potential VPP to the gate terminals of the SG transfer gates 72 and 74 if the decode signal that is output from the inverter circuit 62 is at the H level. That is, they constitute a level shift circuit which outputs the L-level voltage and the potential VPP to the gate terminals of the SG transfer gates 72 and 74 if the output of the inverter circuit 62 is at the L level (ground potential) and the H level, respectively.

An SG transfer gate 46 is provided with a drain-side select gate line transfer transistor 72 and a source-side select gate line transfer transistor 74. The gate terminals of the drain-side select gate line transfer transistor 72 and the source-side select gate line transfer transistor 74 are connected together to the signal line that connects the SG high-voltage level shifter 44 to the SG transfer gate 46. The conduction/non-conduction of the drain-side select gate line transfer transistor 72 and the source-side select gate line transfer transistor 74 is controlled according to the signal that is output from the SG high-voltage level shifter 44.

A drain-side select gate line 76 (indicated by symbol SGD in FIG. 4) in the memory cell blocks 34 is connected to the source terminal of the drain-side select gate line transfer transistor 72. A signal line 86 for supplying a voltage to the drain-side select gate line 76 of a selected block is connected to the drain terminal of the drain-side select gate line transfer transistor 72. The source terminal of a high-voltage NMOS transistor 78 is also connected to the drain-side select gate line 76. A signal line SGDS for supplying a voltage to the drain-side select gate line 76 of an unselected block is connected to the drain terminal of the high-voltage NMOS transistor 78. The terminal RDECADn2 is connected to the gate terminal of the high-voltage NMOS transistor 78. That is, referring to FIG. 4, in the SG transfer gate 46 of the left-hand row control circuit 16, the high-voltage NMOS transistor 78 is provided so as to correspond to the block i+2 (memory block 34; see FIGS. 3 and 4). Furthermore, referring to FIG. 4, in the SG transfer gate 46 of the right-hand row control circuit 16, the high-voltage NMOS transistor 78 is provided so as to correspond to the block i+1 (memory block 34; see FIGS. 3 and 4).

A source-side select gate line 82 (indicated by symbol SGS in FIG. 4) in the memory cell blocks 34 is connected to the source terminal of the source-side select gate line transfer transistor 74. A signal line 88 for supplying a voltage to the source-side select gate line 82 of a selected block is connected to the drain terminal of the source-side select gate line transfer transistor 74. The source terminal of a high-voltage NMOS transistor 84 is also connected to the source-side select gate line 82. A signal line SGDS for supplying a voltage to the drain-side select gate line 82 of an unselected block is connected to the drain terminal of the high-voltage NMOS transistor 84. The terminal RDECADn2 is connected to the gate terminal of the high-voltage NMOS transistor 84. That is, referring to FIG. 4, in the SG transfer gate 46 of the left-hand row control circuit 16, the high-voltage NMOS transistor 84 is provided so as to correspond to the block i+2 (memory block 34; see FIGS. 3 and 4). Furthermore, referring to FIG. 4, in the transfer gate 46 of the right-hand row control circuit 16, the high-voltage NMOS transistor 84 is provided so as to correspond to the block i+1 (memory block 34; see FIGS. 3 and 4).

Since the drain-side select gate line transfer transistor 72, the source-side select gate line transfer transistor 74, the drain-side select gate line 76, the source-side select gate line 82, and the high-voltage NMOS transistors 78 and 84 are connected in the above-described manner, if the block i+2 (memory block 34; see FIGS. 3 and 4), for example, is a selected block, voltages are supplied to the select gate lines SGD and SGS of the selected block when the SG transfer gate 46 of the left-hand row control circuit 16 (see FIG. 4) is activated. An address signal RDECAD2 that designates the block i+2 of the blocks i+1 and i+2 is input to the second input terminal of the NAND circuit 60 of the SG high-voltage level shifter 44, and an RDECADn2 signal is input to the gate terminals of the high-voltage NMOS transistors 78 and 84. Therefore, voltages are supplied to the select gate lines SGD and SGS of the block i+1 (memory cell block 34) as an unselected block and voltages are supplied to the select gate lines SGD and SGS of the block i+2 (memory cell block 34) as a selected block.

Figure 7:
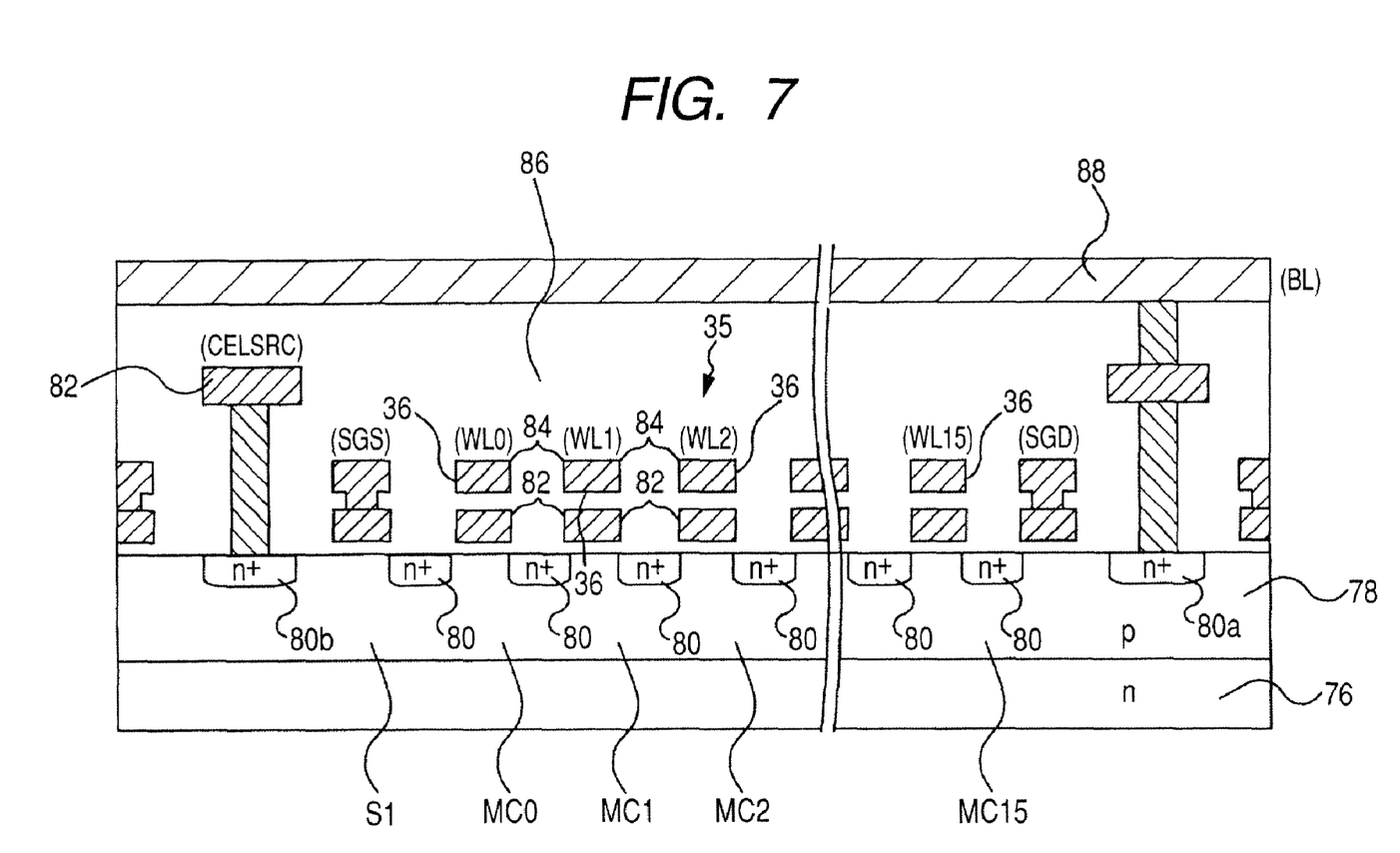
FIG. 7 is an exemplary sectional view, taken along a bit line, of one NAND cell unit of a memory cell block according to the first embodiment of the invention.

FIG. 7 is a sectional view, taken along a bit line (BL) 88, of one NAND cell unit 35 of a memory cell block 34. Memory cells MC are formed in a p-well 78 which is formed in an n-type silicon substrate or an n-well 76. Adjoining memory cells MC share a source/drain diffusion layer 80, and each memory cell MC has a layered structure including a floating gate 82 and a control gate 84. Each control gate 84 is formed by patterning a word line 36 which is common to plural memory cells MC that are arranged perpendicularly to the paper surface of FIG. 7. The memory cell array 12 is covered with an interlayer insulating film 86. A source-side select gate line 82, buried in the interlayer insulating film 86, in the memory cell block 34 is in contact with a source diffusion layer 80b of one select gate transistor S1 (source-side select gate transistor). The bit line (BL) 88 which is formed on the interlayer insulating film 86 is in contact with a drain diffusion layer 80a of the other select gate transistor S2 (drain-side select gate transistor). The contacts of the source-side select gate line 82 and the bit line 88 are shared with the adjacent NAND cell unit 35.

As described above, in each memory cell block 34 of the memory cell array 12, adjoining memory cells MC in each NAND cell unit 35 share a diffusion layer and adjoining NAND cell units 35 share wiring contacts. Striped device regions and device isolation regions are arranged alternately in the direction perpendicular to the paper surface of FIG. 7, and memory cells MC are formed at the crossing points of the device regions and striped word lines 36 which extend perpendicularly to the device regions (a detailed description will not be made).

In the following, for convenience of description, the blocks i+1 and i+2 (memory cell blocks 34) are taken as examples and a description will be made of a case that the block i+2 is driven.

When a control signal is output from the state machine 26 shown in FIG. 1, the address decoder 38 of each row control circuit 16 outputs an RDECAD signal on the basis of the control signal. As shown in FIG. 5, the RDECAD signal is input to the first input terminal of the NAND circuit 60 of the SG high-voltage level shifter 44. At this time, in the left-hand row control circuit 16 (see FIG. 4), an address signal RDECAD2 which designates the block i+2 of the blocks i+1 and i+2 is input to the second input terminal of the NAND circuit 60 and an RDECADn2 signal which is the NAND of the RDECAD signal and the RDECADn2 signal is output from the output terminal of the NAND circuit 60.

When the signal that is output from the output terminal of the NAND circuit 60 is input to the input terminal of the Inverter 62, the Inverter 62 outputs a decode signal for selecting the block i+2 (memory cell block 34; see FIGS. 3 and 4).

The decode signal is input to the gate terminal of the high-voltage NMOS transistor 64 and the RDECADn2 signal is input to the gate terminal of the high-voltage NMOS transistor 68, whereby the high-voltage NMOS transistor 64 and the high-voltage PMOS transistor 70 are turned on. As a result, the boosted voltage VPP is transferred to the drain terminal of the high-voltage PMOS transistor 70 and is output from the connecting point of the high-voltage NMOS transistor 68 and the high-voltage PMOS transistor 70.

In the above-described manner, a high-voltage signal is output from the SG high-voltage level shifter 44 to the SG transfer gate 46.

When the high-voltage signal which is output from the SG high-voltage level shifter 44 is input to the SG transfer gate 46, in the SG transfer gate 46 both of the drain-side select gate line transfer transistor 72 and the source-side select gate line transfer transistor 74 are turned on. Voltages to be supplied to the select gate lines SGD and SGS of the selected block are applied to the drain-side select gate line 76 and the source-side select gate line 82 from the drain terminal of the drain-side select gate line transfer transistor 72 and the drain terminal of the source-side select gate line transfer transistor 74, respectively. At this time, the above-mentioned RDECADn2 signal (L-level signal) is input to the gate terminals of the high-voltage NMOS transistors 78 and 84. Therefore, both of the high-voltage NMOS transistors 78 and 84 are cut off, as a result of which SGD and SGS signals for the selected block are supplied to only the select gate lines SGD and SGS of the block i+2 (memory cell block 34).

Voltages are thus supplied to the select gate lines SGD and SGS of the block i+2 (memory cell block 34).

On the other hand, referring to FIG. 6, when the RDECAD signal is output from the address decoder 38, it is also input to the word line high-voltage level shifter 40. At this time, when receiving a signal (H-level signal) from the BSTON terminal 52, the depletion-type NMOS transistor 48 and the high-voltage depletion-type NMOS transistor 50 of the word line high-voltage level shifter 40 transfers the RDECAD signal received from the address decoder 38 to the gate terminals of the word line transfer gates 43. The inverter 54 outputs, to the gate terminals of the high-voltage PMOS transistor 56, an RDECADn signal which is an inverted level of the RDECAD signal. The high-voltage PMOS transistor 56 and the high-voltage depletion-type NMOS transistor 58 are turned on by the input of the RDECADn signal, and the voltage of the gate terminals of the word line transfer gates 43 is increased to the voltage VPP2 through positive feedback amplification.

The word line transfer gates 43, which are connected to the signal lines CG0, CG1, . . . , CG31, are controlled (i.e., rendered conductive or non-conductive) according to the voltage that is input to their gate terminals from the word line high-voltage level shifter 40. In this manner, the word lines 36 connected to the blocks i+1 and i+2 (memory cell blocks 34) are activated by the row control circuits 16 which are located on both sides (see FIG. 4). Therefore, although the word lines 36 of the two blocks (blocks i+1 and i+2) are activated, as described above the select gate lines of only the block i+2 are activated. As a result, the block i+2 (memory cell block 34) is driven as a selected block.

At this time, the block i+2 (memory cell block 34) is supplied with signals from both sets of word line transfer gates 43 of the pair of row control circuits 16 and the signals reach all the NAND cell units 35 in the blocks i+1 and i+2 (memory cell blocks 34). Therefore, where each memory cell block 34 is driven by both (i.e., the pair of) row control circuits 16, the time that is taken until all the NAND cell units 35 are driven is shorter than in the conventional case where each memory cell block 34 is driven by only a single row decoder. This makes it possible to improve the operation speed of a memory cell block 34 as a subject of driving.

The word lines 36 which are connected to the signal lines CG0, CG1, . . . , CG31 are shared by the blocks i+1 and i+2 (two adjoining memory cell blocks 34), and hence these two memory cell blocks 34 share the word line high-voltage level shifter 40 and the word transfer gates 43 of each of the pair of row control circuits 16. Therefore, the occupation area of the row control circuits 16 (i.e., the area that is necessary for forming all the row control circuits 16 in the nonvolatile semiconductor storage device 10) can be made smaller than in the case where a pair of row control circuits are provided for each memory cell block 34 (i.e., the above-mentioned conventional configuration in which the number of row control circuits is two times the number of memory cell blocks 34). Increase of the chip area can thus be suppressed.

Figure 12:
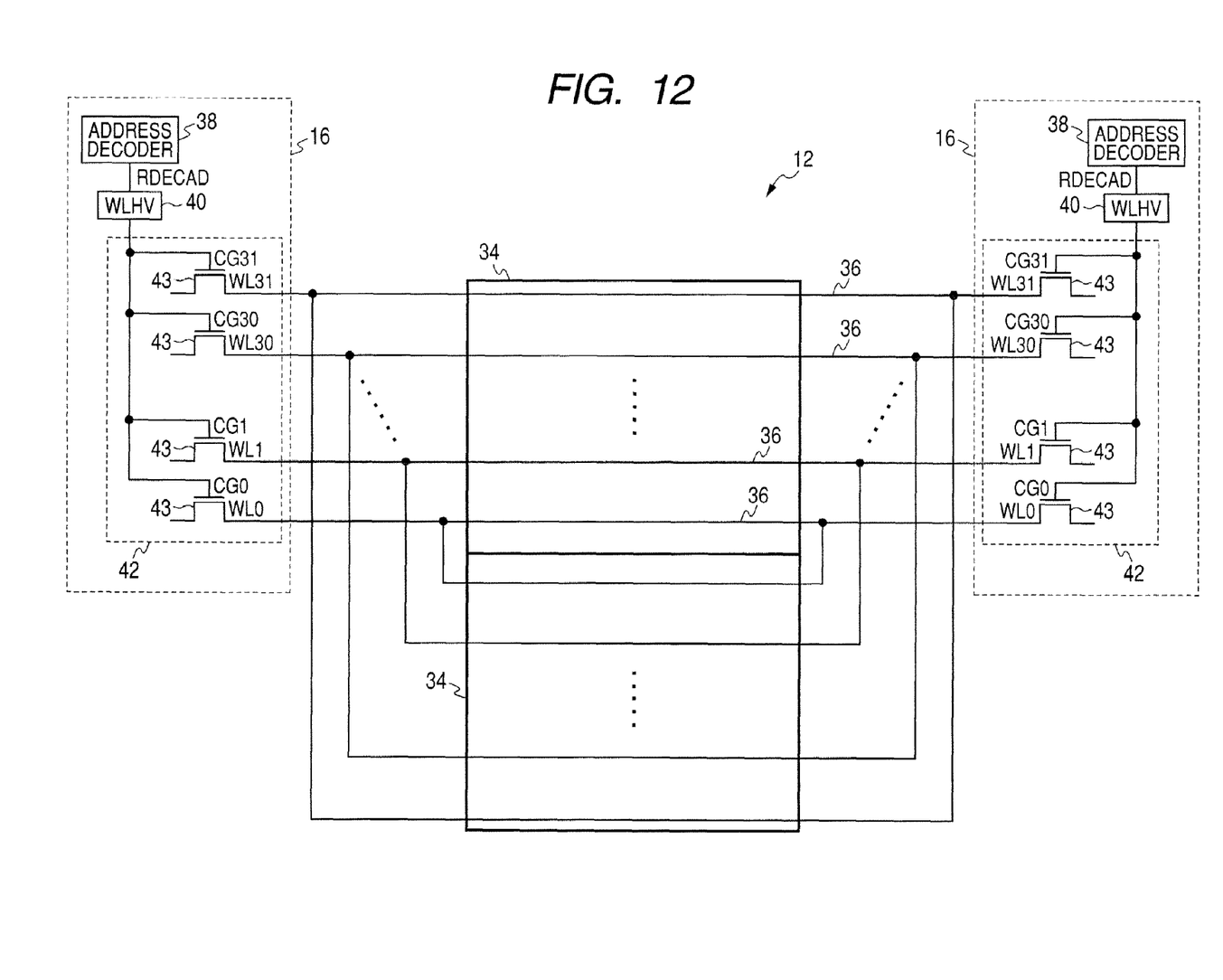
FIG. 12 is an exemplary schematic diagram showing a relationship between row control circuits, a memory cell array and a word line according to the first embodiment of the invention.

Specifically, memory cell block 34 and word line 36 may be configured as FIG. 12.

As described above, the nonvolatile semiconductor storage device 10 according to the first embodiment of the invention can suppress increase of the chip area and improve the operation speed of the memory cell blocks 34.

Second Embodiment

In the first embodiment, two memory cell blocks share a pair of row control circuits. The second embodiment is based on the configuration of the first embodiment and is further characterized in that adjoining memory cell blocks share a drive circuit, in a row control circuit, of a source-side select gate line SGS located between them in the case where the adjoining memory cell blocks share the source-side select gate line SGS.

Figure 8:
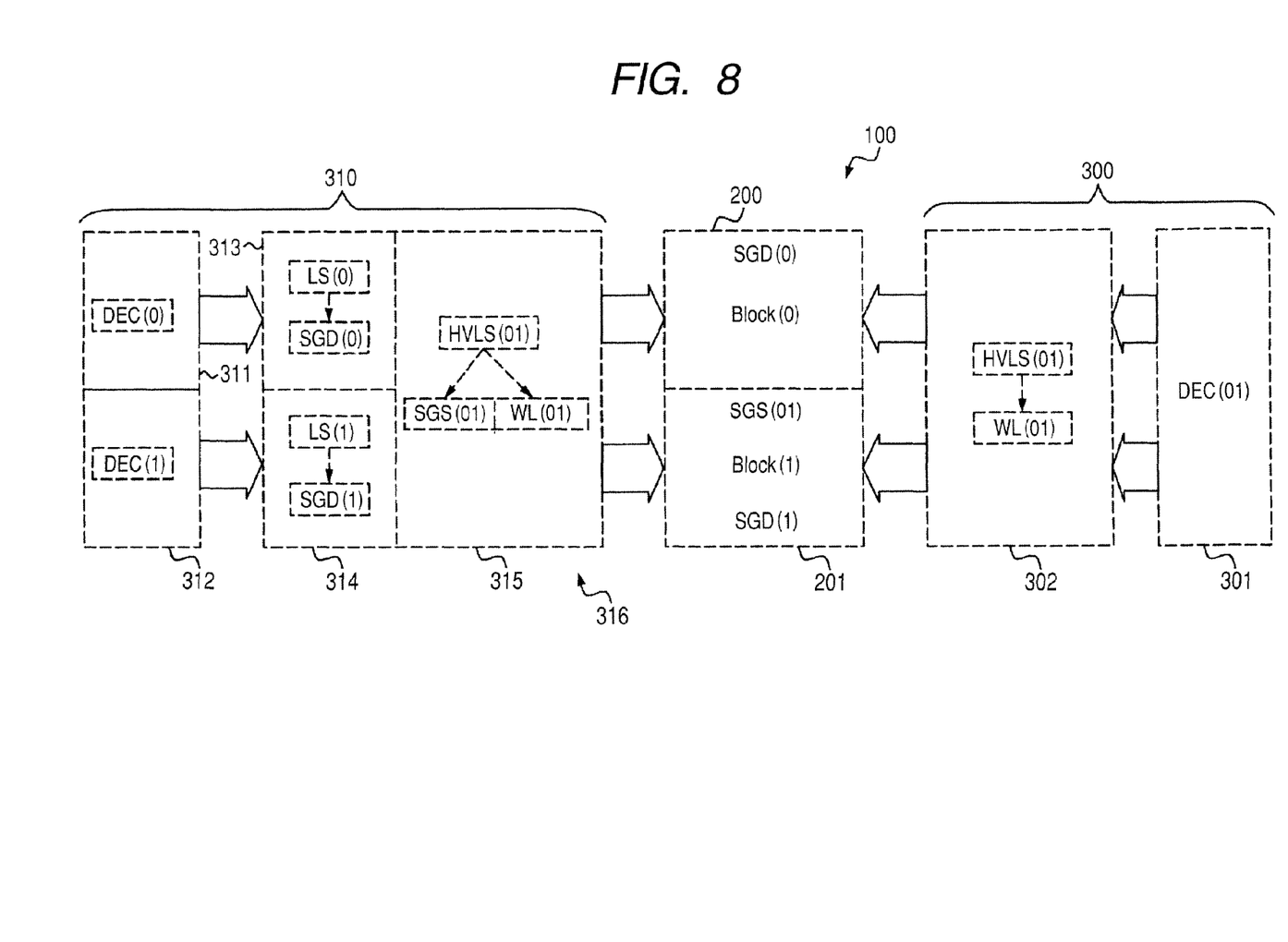
FIG. 8 is an exemplary block diagram showing an important part of a nonvolatile semiconductor storage device according to a second embodiment of the invention.

FIG. 8 is a block diagram showing a general configuration of row control circuits according to the second embodiment. As shown in FIG. 8, in a nonvolatile semiconductor storage device 100, row control circuits 300 and 310 are provided on both (i.e., right and left in FIG. 8) sides of two memory cell blocks 200 and 201. The memory cell blocks 200 and 201 share a source-side select gate line SGS (01) that is located at the boundary between them. The right-hand row control circuit 300 (see FIG. 8) is provided with an address decoder 301 for generating an RDECAD signal (mentioned above) for access to each of the memory cell blocks 200 and 201 and a word line drive section 302 for selectively driving (activating) the word lines in each of the memory cell blocks 200 and 201 according to the RDECAD signal.

The left-hand row control circuit 310 (see FIG. 8) is provided with address decoders 311 and 312 for generating RDECAD signals (mentioned above) for access to the two memory cell blocks 200 and 201, SGD drive sections 313 and 314 for generating SGD drive signals for driving of the drain-side select gate lines SGD in the memory cell blocks 200 and 201 according to the RDECAD signals received from the address decoders 311 and 312, respectively, and a word line/SGS drive section 316. The word line/SGS drive section 316 incorporates an SGS drive section 315 for generating an SGS drive signal for driving of the source-side select gate line SGS in the memory cell blocks 200 and 201 according to the RDECAD signals received from the respective address decoders 311 and 312 and a word line drive section for selectively driving (activating) the word lines in each of the memory cell blocks 200 and 201.

Figure 10:
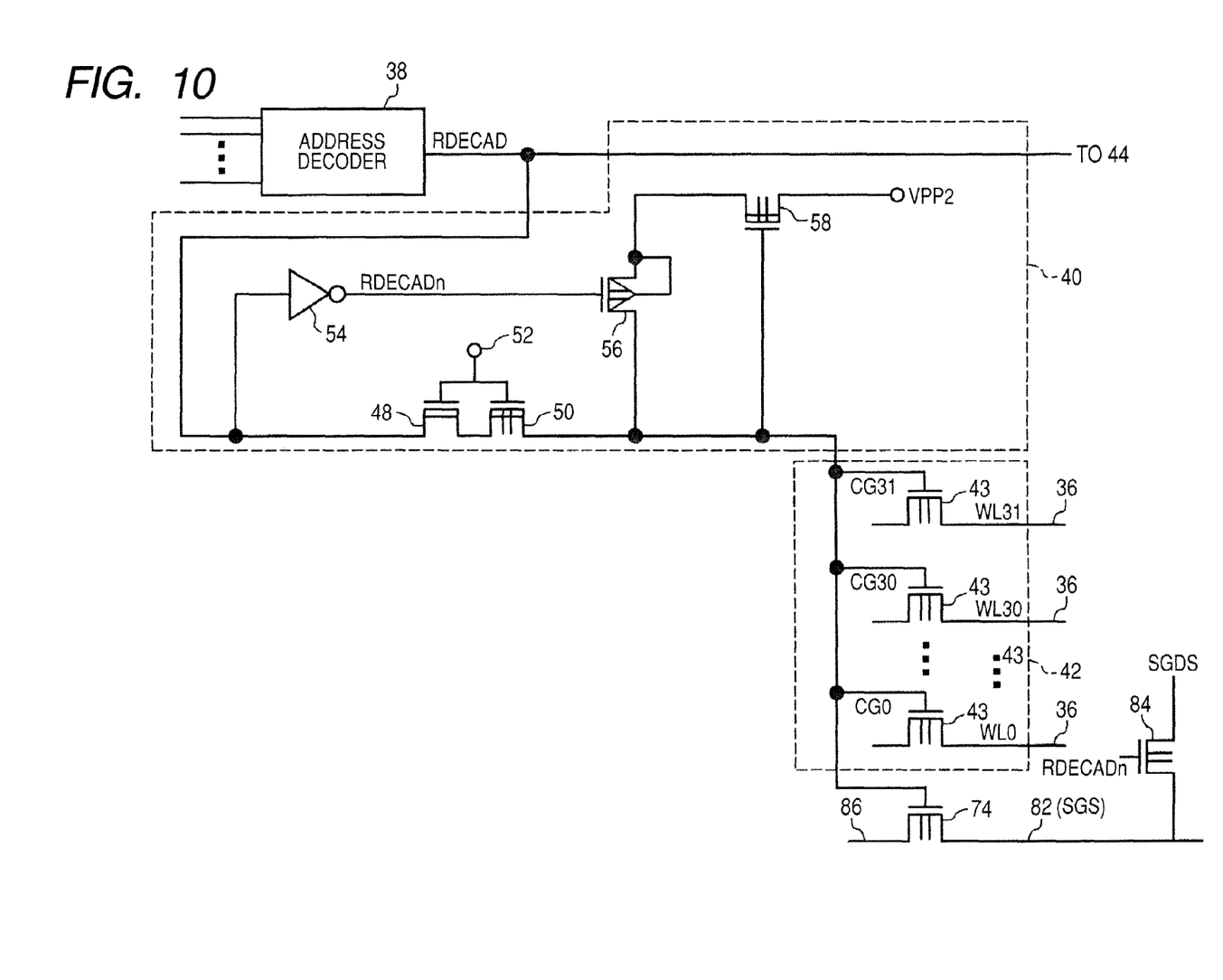
FIG. 10 is an exemplary circuit diagram showing the configuration of a word line/SGS drive section according to the second embodiment of the invention.

FIG. 10 is a specific circuit diagram of the word line/SGS drive section 316. The same circuits as shown in FIGS. 5 and 6 are given the same reference numerals as in FIGS. 5 and 6. The circuit of FIG. 10 is different from the circuit of FIG. 6 in that the gate terminals of the word line transfer gates 43 plus the gate terminal of the source-side select gate line transfer transistor 74 are connected together. Since the unit of sharing of the source-side select gate line is the same as that of the word lines, the output of the word line high-voltage level shifter 40 can share the gate terminals of the word line transfer gates 43 and the gate terminal of the source-side select gate line transfer transistor 74.

Figure 11:
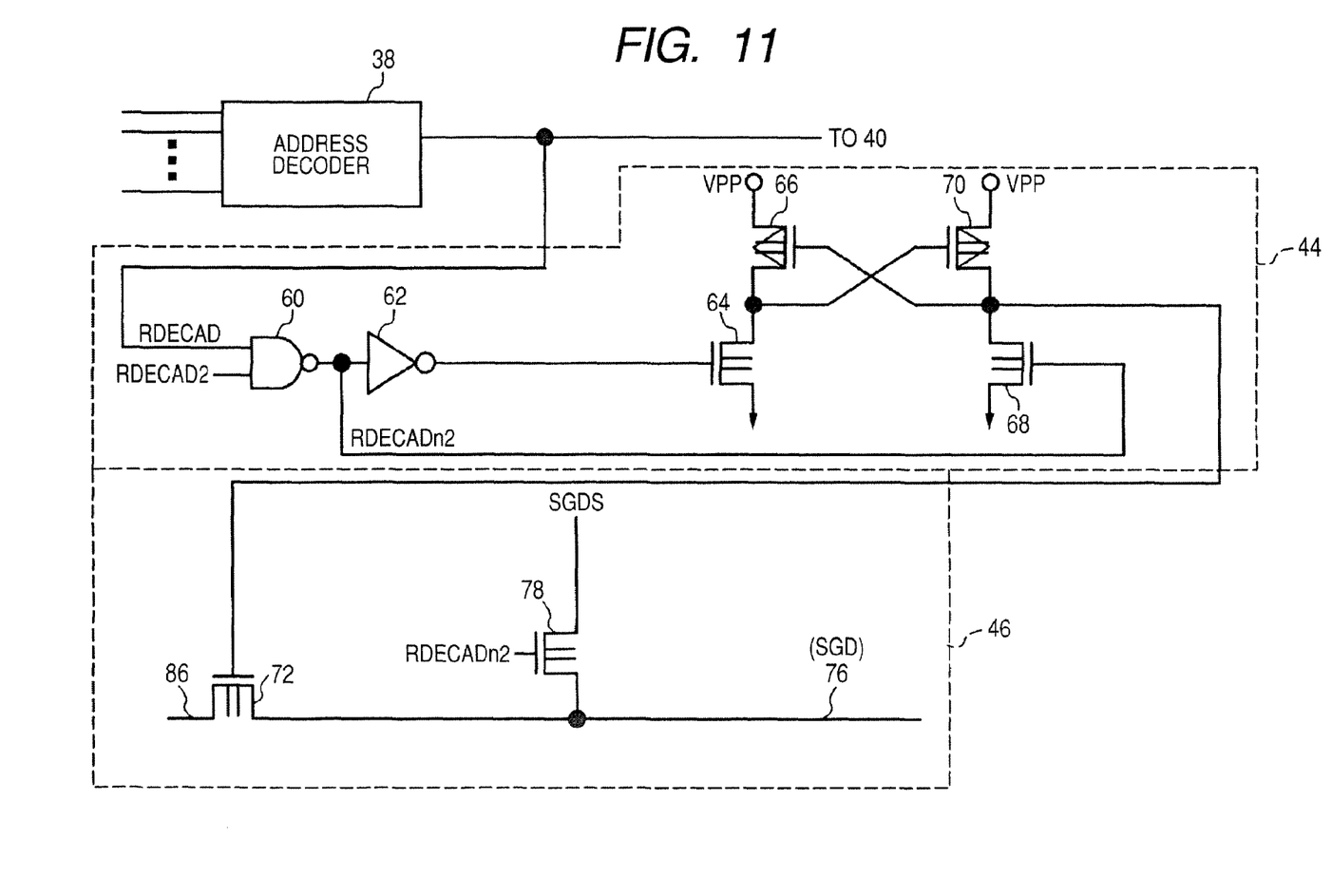
FIG. 11 is an exemplary circuit diagram showing the configuration of each SGD drive section according to the second embodiment of the invention.

FIG. 11 is a specific circuit diagram of each of the SGD drive sections 313 and 314. The same circuits as shown in FIG. 5 are given the same reference numerals as in FIG. 5. The circuit of FIG. 11 is different from the circuit of FIG. 5 in that the former is not provided with the high-voltage NMOS transistors 74 and 84 for driving the source-side select gate line 82. Therefore, the number of source-side select gate line SGS drive sections 315 can be reduced by one per two memory cell blocks.

As described above, in the nonvolatile semiconductor storage device 100 according to the second embodiment, the SGS drive section 315 for driving the source-side select gate line SGS (01) which is located at the boundary between the memory cell blocks 200 and 201 and is thus shared by the memory cell blocks 200 and 201 is shared by the memory cell blocks 200 and 201. This makes it possible to further suppress increase of the chip area.

Third Embodiment

The third embodiment is based on the configuration of the second embodiment and is further characterized in that adjoining memory cell blocks share an SGD drive circuit and the other adjoining memory cell blocks share an SGS drive circuit in row control circuits in the case where the former adjoining memory cell blocks share a drain-side select gate line SGD located between them and the latter adjoining memory cell blocks share a source-side select gate line SGS located between them.

Figure 9:
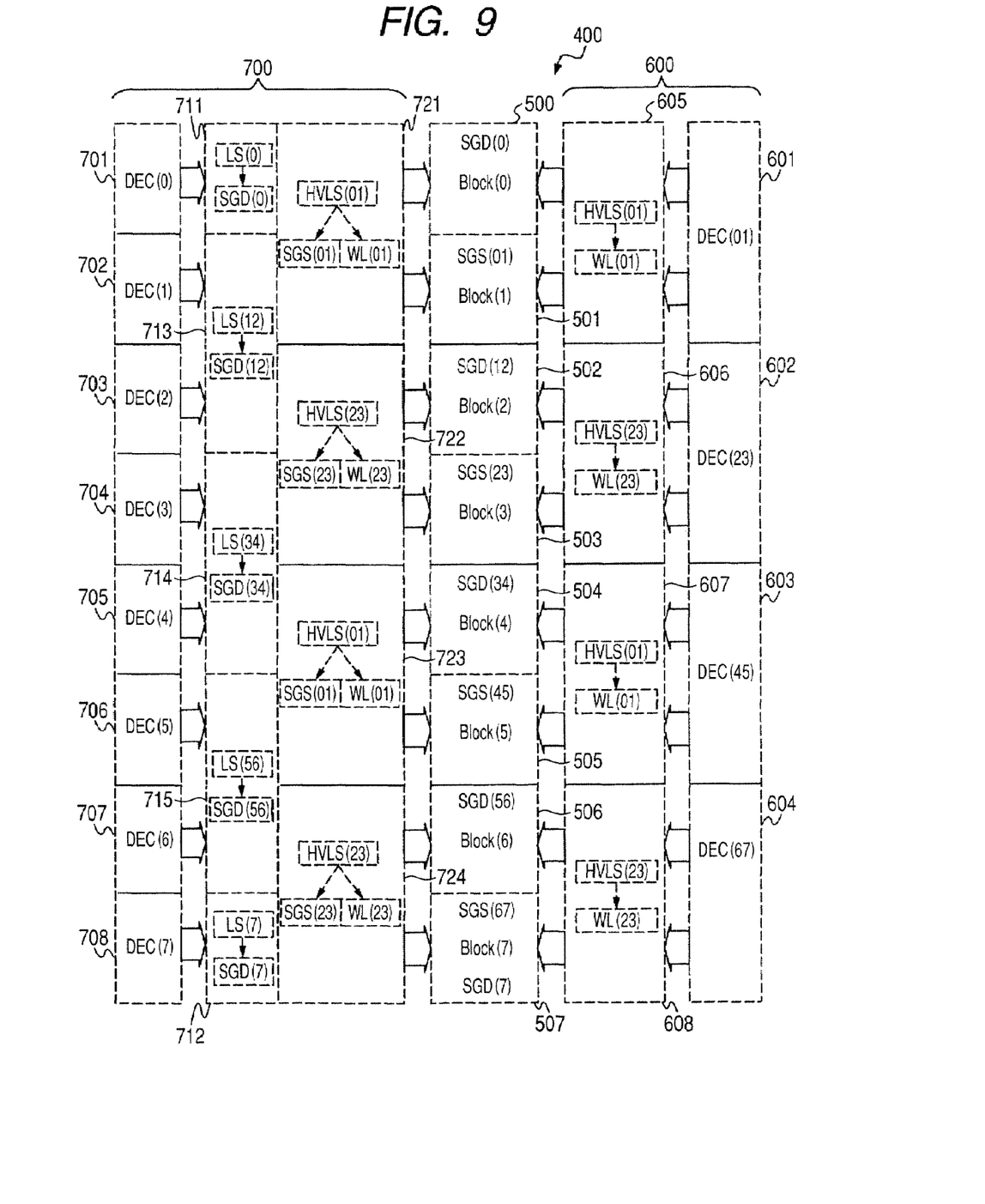
FIG. 9 is an exemplary block diagram showing an important part of a nonvolatile semiconductor storage device according to a third embodiment of the invention.

FIG. 9 is a block diagram showing a general configuration of row control circuits according to the third embodiment. As shown in FIG. 9, in a nonvolatile semiconductor storage device 400, row control circuits 600 and 700 are provided on both (i.e., right and left in FIG. 9) sides of eight memory cell blocks 500-507. In the memory cell blocks 500-507, adjoining memory cell blocks share a select gate line SGS and other adjoining memory cell blocks share a select gate line SGD.

The right-hand (see FIG. 9) row control circuit 600 is provided with address decoders 601-604 for generating RDECAD signals (mentioned above) each for access to two of the memory cell blocks 500-507 and word line drive sections 605-608 each for selectively driving (activating) the word lines of two of the memory cell blocks 500-507.

The left-hand (see FIG. 9) row control circuit 700 is provided with address decoders 701-708 for generating RDECAD signals (mentioned above) for accessing the memory cell blocks 500-507 on a block-by-block basis, an SGD drive section 711 for generating an SGD drive signal for driving of the drain-side select gate line SGD in the memory cell block 500 according to the RDECAD signal that is received from the address decoder 701, an SGD drive section 712 for generating an SGD drive signal for driving of the drain-side select gate line SGD in the memory cell block 507 according to the RDECAD signal that is received from the address decoder 708, SGD drive sections 713-715 each for generating an SGD drive signal for driving of the drain-side select gate line SGD of two adjoining blocks of the memory cell blocks 500-507 according to the corresponding two of the RDECAD signals received from the respective address decoders 702-707, and word line/SGS drive sections 721-724 each of which generates an SGS drive signal driving the source-side select gate line SGS of two adjoining blocks of the memory cell blocks 500-507 according to the corresponding two of the RDECAD signals received from the respective address decoders 701-708 and selectively drives (activates) the word lines in the two adjoining blocks of the memory cell blocks 500-507.

The memory blocks 500 and 507 are end blocks. The circuit configuration of the SGD drive sections 711 and 712 for applying SGD drive signals to these memory cell blocks 500 and 507 is different from that of the other SGD drive sections 713-715 for applying SGD drive signals to the ordinary memory cell blocks 501-506. In the left-hand row control circuit 700, the SGD drive sections 713-715 and the SGS drive sections 721-724 are shifted from each other by one memory cell block. Therefore, as for the address decoders 701-708 shown in FIG. 9, logical operations are performed on selection signals (RDECAD signals) generated by adjoining address decoders k−1, k, and k+1, whereby either of a signal that serves for activation when the memory cell block k−1 or k is selected and a signal that serves for activation when the memory cell block k or k+1 is selected can be selected.

As described above, in the nonvolatile semiconductor storage device 400 according to the third embodiment, in the left-hand row control circuit 700, the SGD drive sections 713-715 each for driving a drain-side select gate line SGD that is located at the boundary between adjoining ones of the memory cell blocks 500-507 and is thus shared by the adjoining memory blocks and the SGS drive sections 721-724 each for driving a source-side select gate line that is located at the boundary between adjoining ones of the memory cell blocks 500-507 and is thus shared by the adjoining memory blocks are shifted from each other by one memory cell block. This makes it possible to further suppress increase of the chip area.

In the invention, the manner of sharing of the word lines, the source-side select gate lines, and the drain-side select gate lines is arbitrary (exemplary manners are shown in FIGS. 3, 8, and 9). And the same advantages can be obtained irrespective of the manner of sharing of the select gate lines as long as adjoining blocks share word lines. Furthermore, the circuit configurations of the word line drive section, the SGD drive section, the SGS drive section, the word line high-voltage level shifter, and the SG high-voltage level shifter that have been described in the embodiments of the invention are just examples, and the same advantages can be obtained by other circuit configurations.

As described with reference to the embodiment, there is provided a nonvolatile semiconductor storage device capable of suppressing increase of the chip area and improvement of the operation speed of the memory cell blocks.

What is claimed is:

1. A nonvolatile semiconductor memory comprising:
a plurality of memory cell blocks, including
a first memory cell block including a plurality of first memory cells, and
a second memory cell block including a plurality of second memory cells;
first word lines each connected to the first memory cell block;
second word lines each connected to the second memory cell block; and
a pair of drive circuits disposed to sandwich the first and second memory cell blocks and connected to the first and second word lines to apply a voltage to the first and second word lines,
wherein each of the first word lines is connected to a respective one of the second word lines.

2. The nonvolatile semiconductor memory according to claim 1, wherein each of the memory cell blocks includes a source side select gate and a drain side select gate,
wherein a plurality of memory cells that are serially connected to each other has one end connected to the source side select gate, and has the other end-connected to the drain side select gate.

3. A nonvolatile semiconductor memory comprising:
a plurality of memory cell blocks each including a plurality of memory cells serially connected to each other;
a word line that is connected to corresponding ones of the plurality of memory cells each included in respective one of the plurality of memory cell blocks; and
a pair of drive circuits each configured to apply a voltage to the word line lines,
wherein the corresponding ones of the plurality of memory cells are connected to the word line between the pair of drive circuits
wherein each of the memory cell blocks includes a source side select gate and a drain side select gate,
wherein the plurality of memory cells that are serially connected to each other has one end connected to the source side select gate, and has the other end connected to the drain side select gate,
wherein the plurality of memory cell blocks include a pair of memory cell blocks arranged adjacent to each other, and
wherein the drain side select gate of one of the pair of memory cell blocks functions as the drain side select gate of the other.

4. A nonvolatile semiconductor memory comprising:
a plurality of memory cell blocks each including a plurality of memory cells serially connected to each other;
a word line that is connected to corresponding ones of the plurality of memory cells each included in respective one of the plurality of memory cell blocks; and
a pair of drive circuits each configured to apply a voltage to the word line lines,
wherein the corresponding ones of the plurality of memory cells are connected to the word line between the pair of drive circuits
wherein each of the memory cell blocks includes a source side select gate and a drain side select gate,
wherein the plurality of memory cells that are serially connected to each other has one end connected to the source side select gate, and has the other end connected to the drain side select gate,
wherein the plurality of memory cell blocks include a pair of memory cell blocks arranged adjacent to each other, and
wherein the source side select gate of one of the pair of memory cell blocks functions as the source side select gate of the other.

5. The nonvolatile semiconductor memory according to claim 2, further comprising:
a select gate driver that drives the source side select gate and the drain side select gate; and
a level shifter that is connected to the select gate driver.

6. The nonvolatile semiconductor memory according to claim 5, wherein the level shifter includes a plurality of level shifters correspondingly to the plurality of memory cell blocks.

7. The nonvolatile semiconductor memory according to claim 1, wherein the plurality of memory cells has a structure of an NAND flash memory.

8. The nonvolatile semiconductor memory according to claim 1, wherein each of the memory cells has a charge storage layer.

9. The nonvolatile semiconductor memory according to claim 1, wherein each of the memory cells has a floating gate.

10. A nonvolatile semiconductor memory comprising:
a first memory cell block that includes a plurality of first memory cells;
a second memory cell block that includes a plurality of second memory cells;
a plurality of first word lines connected to the first memory cells;
a plurality of second word lines connected to the second memory cells; and
a pair of drive circuits each connected to the first and second word lines,
wherein each of the first word lines is connected to a respective one of the second word lines.

11. The nonvolatile semiconductor memory according to claim 10, wherein the first memory cell block includes:

a first memory cell string that has a plurality of memory cells connected in series;

a first source side select gate that is connected to one end of the first memory cell string; and a first drain side select gate that is connected to the other end of the of the first memory cell string.

12. The nonvolatile semiconductor memory according to claim 11, wherein the second memory cell block includes:

a second memory cell string that has a plurality of memory cells connected in series;

a second source side select gate that is connected to one end of the second memory cell string;

a second drain side select gate that is connected to the other end of the of the second memory cell string; and wherein the first source side select gate is connected to the second source side select gate.

13. The nonvolatile semiconductor memory according to claim 12, further comprising:

a third memory cell block including:

a third memory cell string that has a plurality of third memory cells connected in series; and a third source side select gate that is connected to one end of the third memory cell string;

a third drain side select gate that is connected to the other end of the of the third memory cell string;

a first select gate control circuit that drives the first source side select gate and the first drain side select gate; and wherein the first drain side select gate is connected to the third drain side select gate.

14. The nonvolatile semiconductor memory according to claim 13, wherein the second memory cell block includes:

a second memory cell string that has a plurality of memory cells connected in series;

a second source side select gate that is connected to one end of the second memory cell string;

a second drain side select gate that is connected to the other end of the of the second memory cell string; and wherein the first drain side select gate is connected to the second drain side select gate.

15. The nonvolatile semiconductor memory according to claim 12, further comprising:

a third memory cell block including:

a third memory cell string that has a plurality of third memory cells connected in series; and a third source side select gate that is connected to one end of the third memory cell string;

a third drain side select gate that is connected to the other end of the of the third memory cell string;

a first select gate control circuit that drives the first source side select gate and the first drain side select gate; and wherein the first source side select gate is connected to the third source side select gate.

16. The nonvolatile semiconductor memory according to claim 10, wherein the plurality of memory cells has a structure of an NAND flash memory.

17. The nonvolatile semiconductor memory according to claim 10, wherein each of the memory cells has a charge storage layer.

18. The nonvolatile semiconductor memory according to claim 10, wherein each of the memory cells has a floating gate.

* * * * *